(12) United States Patent
Yang et al.

(10) Patent No.: US 11,030,096 B2
(45) Date of Patent: Jun. 8, 2021

(54) METHOD OF IDENTIFYING AND PREPARING A KEY BLOCK IN A FLASH MEMORY SYSTEM AND MEMORY CONTROLLER THEREFOR

(71) Applicant: Western Digital Technologies, Inc., San Jose, CA (US)

(72) Inventors: Niles Yang, San Jose, CA (US); Sahil Sharma, San Jose, CA (US); Rohit Sehgal, San Jose, CA (US); Phil Reusswig, San Jose, CA (US)

( * ) Notice: Subject to any disclaimer, the term of this patent is extended or adjusted under 35 U.S.C. 154(b) by 106 days.

(21) Appl. No.: 16/244,252

(22) Filed: Jan. 10, 2019

(65) Prior Publication Data

US 2020/0226065 A1 Jul. 16, 2020

(51) Int. Cl.
  *G06F 12/06* (2006.01)
  *G06F 12/02* (2006.01)
  *G06F 3/06* (2006.01)

(52) U.S. Cl.
  CPC ........ *G06F 12/0646* (2013.01); *G06F 3/0604* (2013.01); *G06F 3/064* (2013.01); *G06F 3/0632* (2013.01); *G06F 3/0679* (2013.01); *G06F 12/0246* (2013.01); *G06F 2212/7201* (2013.01); *G06F 2212/7207* (2013.01)

(58) Field of Classification Search
  CPC ............ G06F 12/0646; G06F 12/0246; G06F 3/0604; G06F 3/0632; G06F 3/064; G06F 3/0679; G06F 2212/7201; G06F 2212/7207
  See application file for complete search history.

(56) References Cited

U.S. PATENT DOCUMENTS

| | | | |
|---|---|---|---|
| 2010/0058066 A1* | 3/2010 | Wang ....................... | G06F 21/80 713/183 |
| 2011/0107018 A1* | 5/2011 | Honda ................... | G06F 3/0644 711/103 |
| 2016/0098355 A1* | 4/2016 | Gorobets ............ | G06F 12/1009 711/203 |
| 2016/0224267 A1* | 8/2016 | Yang ..................... | G06F 3/0631 |
| 2016/0342494 A1* | 11/2016 | Yang ........................ | G11C 7/14 |
| 2018/0059948 A1* | 3/2018 | Lee ........................ | G06F 3/0673 |
| 2019/0371391 A1* | 12/2019 | Cha ..................... | G06F 11/1076 |
| 2019/0391746 A1* | 12/2019 | Papandreou .......... | G06F 3/0665 |

* cited by examiner

*Primary Examiner* — Jane Wei
(74) *Attorney, Agent, or Firm* — Dickinson Wright PLLC; Steven Hurles

(57) ABSTRACT

Preparing a key block in a memory system. Various methods include: selecting a candidate key block of memory; checking a quality of the candidate key block using a word line of the candidate key block; altering operating parameters of the candidate key memory block; and registering the candidate key memory block as the key block. Where altering the operating parameters includes replacing a first set of parameters associated with the first memory block with a second set of parameters, where the first set of parameters includes a first erase parameter, a first program parameter, and a first read parameter, where the memory block operating in a normal block mode is accessed using the first set of parameters, and the second set of parameters includes a second erase parameter, a second program parameter, and a second read parameter, where the first memory block is accessed using the second set of parameters.

18 Claims, 9 Drawing Sheets

STEP 1: SELECT A CANDIDATE KEY BLOCK AND CHECK A QUALITY OF THE CANDIDATE KEY BLOCK

STEP 3: MONITOR THE KEY BLOCK, AND IF AT ANY POINT A CHECK OF THE KEY BLOCK FAILS, MOVE THE DATA

TABLE 306

| LOCATION | BLOCK COUNT | TIMESTAMP |
|---|---|---|
| 302-0, 302-1 | 2 | 0 |
| 302-0, 302-1, 303-N | 3 | 1 |
| 302-0, 302-1, 303-M | 3 | 2 |
| ... | ... | ... |

KEY DATA 340:
- KEY BLOCK 302-0
- KEY BLOCK 302-1
- NORMAL BLOCK 302-2
- KEY BLOCK 303-M ← PREVIOUSLY NORMAL BLOCK 302-3
- ...
- NORMAL BLOCK 302-M ← PREVIOUSLY KEY BLOCK 303-N

METHOD OF IDENTIFYING AND PREPARING A KEY BLOCK IN A FLASH MEMORY SYSTEM AND MEMORY CONTROLLER THEREFOR

BACKGROUND

Non-volatile memory systems retain stored information without requiring an external power source. One type of non-volatile memory, flash memory, is implemented in various hosts—e.g., a computing device—and in stand-alone memory devices—e.g., a memory card. For example, flash memory can be found in a laptop, a digital audio player, a digital camera, a smart phone, a video game, a scientific instrument, an industrial robot, medical electronics, a solid state drive, and a USB drive.

Flash memory stores various types of data including system data specific to operating the flash memory itself ("key data") and other data including data from a host ("host data"). The key data is used during boot up of the flash memory and includes information such as a configuration of the particular flash memory. Without access to the key data, the flash memory is inoperable.

SUMMARY

Various embodiments include a method for preparing a key block in a memory system, including: selecting a candidate key block of memory; checking a quality of the candidate key block using a non-data word line of the candidate key block; altering operating parameters of the candidate key memory block; and registering the candidate key memory block as the key block.

Other embodiments include a memory controller, including: a first port configured to couple to a memory array; the memory controller configured to: select a candidate key block in the memory array, the memory array including a second memory block operating in a normal mode; check a quality of the candidate key block using a non-data wordline of the candidate key block; associate a first set of parameters with the key block, the first set of parameters including a first erase parameter, a first program parameter and a first read parameter; and register the candidate key block as a key block.

Additional embodiments include a non-volatile storage system, configured to monitor a key block, including a memory array storing a first data in a first block of memory in the memory array, where the first block is accessed using a first set of parameters and the first block is a key block; a controller coupled to the memory array, where the controller is configured to: determine a check event has occurred associated with the key block; in response to determining the check event has occurred, perform a secondary read scrub on the key block; and then move the first data to a second key block in the memory array.

BRIEF DESCRIPTION OF THE DRAWINGS

For a detailed description of example embodiments, reference will now be made to the accompanying drawings in which:

FIG. 3D illustrates a conceptual and method diagram in which a key block is selected and monitored, in accordance with some embodiments.

DEFINITIONS

Figure 1:
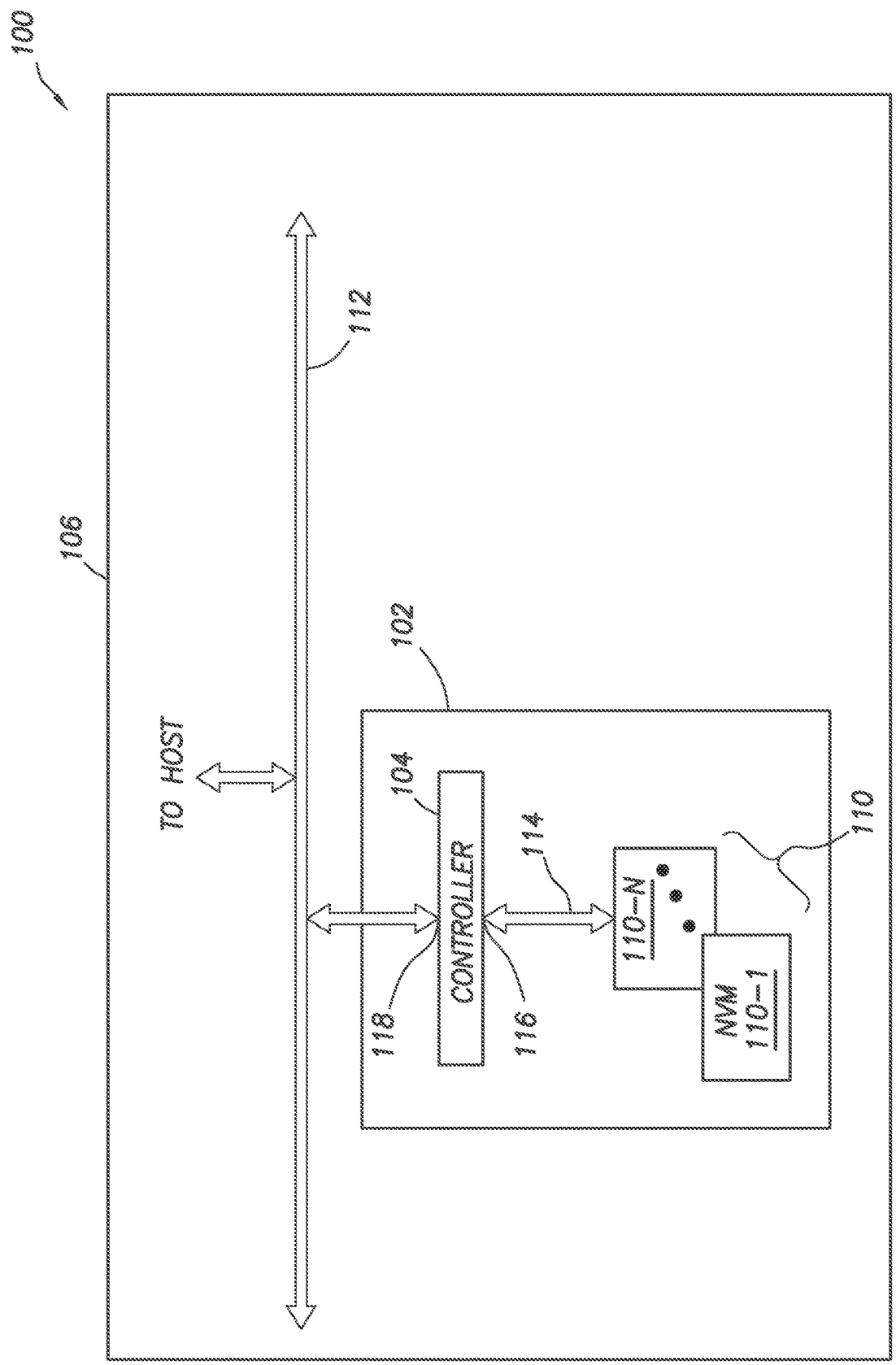
FIG. 1 illustrates a block diagram of an example non-volatile memory system, in accordance with some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

At least some of the example embodiments are directed to preparing a key block in a memory system, including selecting a candidate key block of memory; checking a quality of the candidate key block using a non-data word line of the candidate key block; altering operating parameters of the candidate key block; and registering the candidate key block as the key block. In particular, the memory system uses a separate set of operating parameters to erase, program, and read a key block, than operating parameters used to erase, program, and read a normal block. The disparate treatment of the memory blocks by the storage system 102 is implemented in an effort to provide a more secure and robust storage for data that is specific to the operation and configuration of the storage system 102.

The methods described below additionally include managing the key block by checking the quality of the key memory block and moving key data out of the key block when the quality of the key memory block falls below a threshold value. The quality check of the key block can occur on a periodic basis or can be triggered by an event. In particular, after a memory block has been configured to operate as a key block, the memory system continues to monitor the key block to ensure an integrity of the data stored within the key block. The memory system can determine if a check event has occurred associated with the key block. In response to determining a check event has occurred, the memory system performs a secondary read scrub on the key block. If the memory system encounters a read error or a high bit error rate during the secondary read scrub, the memory system moves the data key data to a different key block, irrespective of whether the key data is recoverable from the key block. After moving the data, the memory system determines a quality of the key block using a non-data word line of the key block. In response to determining the quality of the key block is poor, the memory system flags the key block as faulty.

FIG. 1 illustrates a block diagram of an example system architecture 100 including non-volatile memory. In particular, the example system architecture 100 includes storage system 102, a controller 104, and a host 106. In various embodiments, the host 106 includes any device or system that utilizes the storage system 102—e.g., a computing device. In some embodiments, the storage system 102 is embedded within the host 106—e.g., a solid state disk (SSD) drive installed in a laptop computer. In additional embodiments, the system architecture 100 is embedded within the host 106 such that the host 106 and the storage system 102 including the controller 104 are formed on a single integrated circuit chip. In embodiments where the system architecture 100 is implemented within a memory card, the host 106 can include a built-in receptacle for one or more types of memory cards or flash drives (e.g., a universal serial bus (USB) port, or a memory card slot). Furthermore, the host 106 can use adapters into which a memory card is plugged.

The host 106 includes its own controller (e.g., a processor) configured to execute instructions stored in the storage system 102 and further the host 106 accesses data stored in the storage system 102, referred to herein as "host data". The host data includes data originating from and pertaining to applications executing on the host 106.

In FIG. 1, the storage system 102 includes its own memory controller and drivers (e.g., controller 104)—as will be described further below—but other embodiments of the storage system 102 include memory-only units that are instead controlled by software executed by a controller on the host 106 (e.g., a processor of a computing device controls—including error handling of—the storage unit 102). The host 106 and the storage system 102 communicate by way of a bus 112 that implements any known or after developed communication protocol that enables the storage system 102 and the host 106 to communicate. Some non-limiting examples of a communication protocol include Secure Digital (SD) protocol, Memory stick (MS) protocol, USB protocol, or Advanced Microcontroller Bus Architecture (AMBA).

In various embodiments, the controller 104 serves as an interface between the host 106 and the storage system 102 and manages data stored on the storage system 102. In particular, the controller 104 has at least a first port 116 coupled to a non-volatile memory (NVM) block 110 (hereinafter "memory block") by way of a communication interface 114. Additionally, the controller 114 has at least a second port 118 coupled to the host 106, by way of the bus 112. The first and second ports 116 and 118 can include one or several channels coupled to the memory block 110 or the host 106, respectively.

The controller 104 can include individual circuit components, processing circuitry (e.g., logic gates and switches), a processor, a microprocessor, a microcontroller with controlling software, or a field programmable gate array (FPGA). Furthermore, the example controller 104 can include a computer-readable medium that stores computer-readable program code (e.g., software or firmware) executable by a processor. In some embodiments, the controller 104 is a flash memory controller. In other embodiments, the controller 104 is a processor executing within the host 106.

Still referring to FIG. 1, according to some embodiments, the host 106 accesses host data stored in the storage system 102 by providing a logical address to the controller 104 which the controller 104 converts to a physical address. The controller 104 accesses the data or particular storage location associated with the physical address and facilitates transferring data between the storage system 102 and the host 106. In embodiments where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104). Thus, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1, the memory block 110 of the storage system 102 includes several memory die 110-1-110-N. The manner in which the memory block 110 is defined in FIG. 1 is not meant to be limiting. In some embodiments, the memory block 110 defines a physical set of memory die, such as the memory die 110-1-110-N. In other embodiments, the memory block 110 defines a logical set of memory die, where the memory block 110 includes memory die from several physically different sets of memory die. The memory die 110 include non-volatile memory cells that retain data even when there is a disruption in the power supply. Thus, the storage system 102 can be easily transported and the storage system 102 can be used in memory cards and other memory devices that are not always connected to a power supply.

In various embodiments, the memory cells in the memory die 110 are solid-state memory cells (e.g., flash), one-time programmable, few-time programmable, or many time programmable. Additionally, the memory cells in the memory die 110 can include single-level cells (SLC), multiple-level cells (MLC), or triple-level cells (TLC). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cells, while stacked flash memory includes memory cells that are stacked vertically in multiple layers. Various embodiments of the memory block 110 include NAND flash memory cells or NOR flash memory cells.

Still referring to FIG. 1, the controller 104 and the memory block 110 are communicatively coupled by an interface 114 implemented by several channels (e.g., physical connections) disposed between the controller 104 and the individual memory die 110-1-110-N. The number of channels over which the interface 114 is established varies based on the capabilities of the controller 104. Additionally, a single channel can be configured to communicatively couple more than one memory die. Thus the first port 116 can couple one or several channels implementing the interface 114. Further, the depiction of a single interface 114 is not meant to be limiting as one or more interfaces can be used to communicatively couple the same components. The interface 114 can implement any known or after developed communication protocol. In embodiments where the storage system 102 is flash memory, the interface 114 is a flash interface, such as Toggle Mode 200, 400, or 800, or Common Flash Memory Interface (CFI).

The memory block 110 stores at least two types of data: key data and non-key data. Non-key data includes host data originating from the host 106, while key data includes data specific to the operation and configuration of the storage system 102. Non-key data is stored in a memory block referred to herein as a "normal block," while key data is stored in a memory block referred to herein as a "key block".

In particular, the key data includes information used during the boot up of the storage system 102. Thus the key data stored in a key block benefits from being stored in a safe, secure manner that is immune to operating conditions of the storage system 102 that can cause data to degrade. For example some operating conditions that can impact stored data include data retention, cross temperature, program erase (PE) cycling, read/program/erase disturbs, and read latency. Accordingly, the storage system 102 treats a key block differently from a normal block. For example, if a memory block is configures as a key block, the storage system 102 uses a separate set of operating parameters to erase, program, and read the key block. The disparate treatment of the memory blocks by the storage system 102 is implemented in an effort to provide a more secure and robust storage for data that is specific to the operation and configuration of the storage system 102.

Figure 2A:
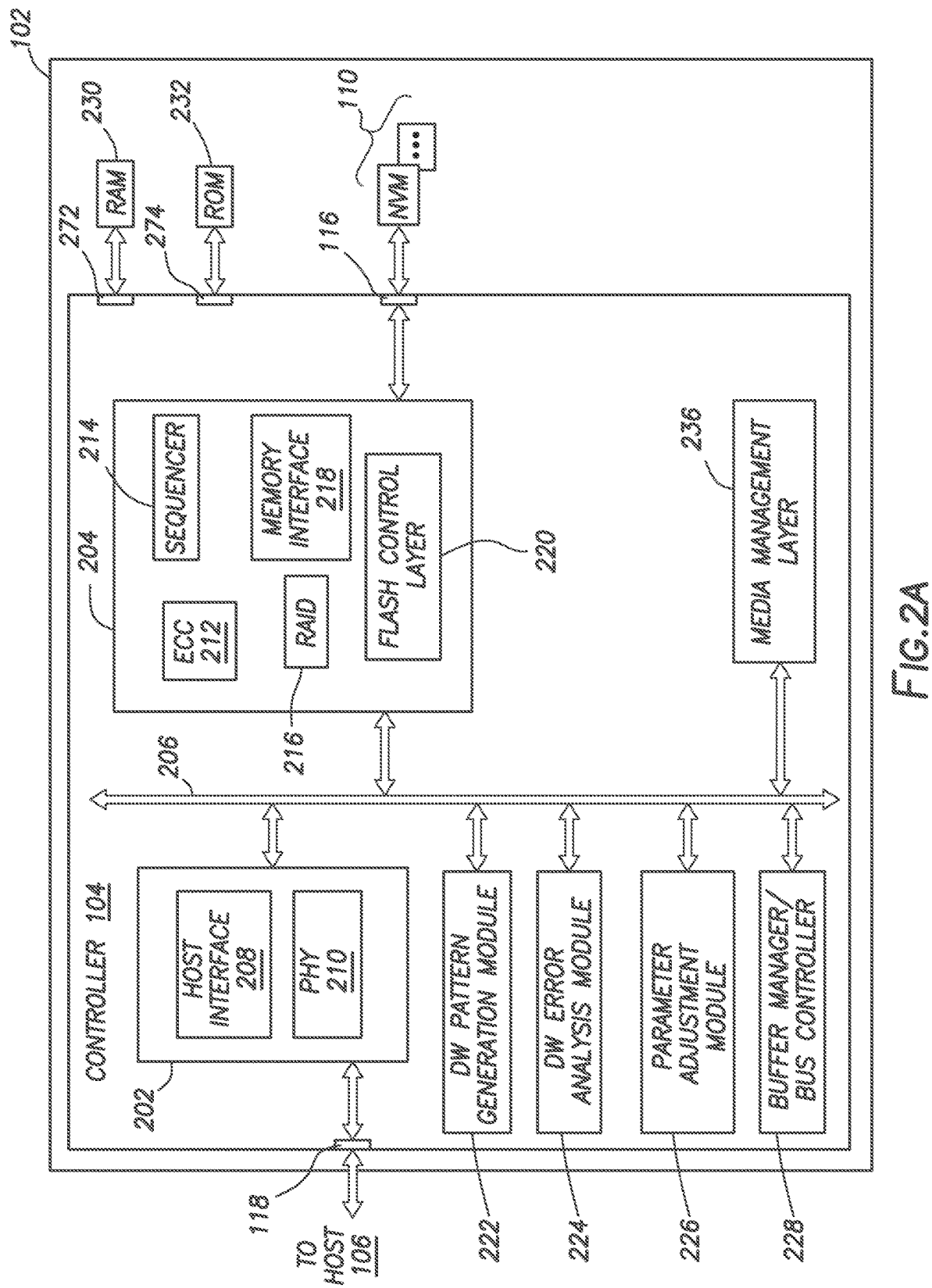
FIG. 2A illustrates a block diagram of example components of a controller, in accordance with some embodiments.

FIG. 2A shows, in block diagram form, a storage system in accordance with at least some embodiments. In FIG. 2A, the storage system 102 illustrates additional details with respect to the controller 104 (introduced in FIG. 1A). The storage system 102 illustrates components previously described in FIG. 1, such as the controller 104, the memory block 110, and the ports 116 and 118. Specifically, in addition to the ports 116 and 118, the example controller 104 includes a random access memory (RAM) port 272, and a read only memory (ROM) port 274.

Example components present within the storage system 102 include a RAM 230, and a ROM 232. The RAM 230 couples the controller 104 by way of the RAM port 272 and the ROM 232 couples the controller 104 by way of the ROM port 274. Although the RAM 230 and the ROM 232 are shown as separate modules within the storage system 102, the illustrated architecture is not meant to be limiting. For example, the RAM 230 and the ROM 232 can be located within the controller 104. In other cases, portions of the RAM 230 or ROM 232, respectively, can be located outside the controller 104. In other embodiments, the controller 104, the RAM 230, and the ROM 232 are located on separate semiconductor die. In various embodiments, the other components 234 include external electrical interfaces, external RAM, resistors, capacitors, logic gates, or other components that interface with the controller 104.

In some embodiments, the ROM 232 stores system boot code. During a startup procedure of the storage system 102, the system boot code stored in the ROM 232 can direct the controller 104 or alternatively the host 106 to search for key data in the key blocks within the memory block 110. In some examples, the key data includes boot up data, file system data, firmware data, log blocks including pointers to control data, control data, error logs, and exclusive or ("XOR") parity data. The file system data includes information about a location of firmware, while the error logs contain information on errors encountered by the storage system 102 and data from the error logs is accessed to perform failure analysis or other debugging procedures.

In one example startup procedure, the controller 104 initially searches for the key block within the memory block 110 that stores boot up data. The boot up data includes information such as a map identifying a location of other key blocks in storage system 102. Thus, upon accessing the key block storing the boot up data, the controller 104 next accesses firmware which is downloaded from the memory block 110 into the RAM 230. The discussion now turns to the various example modules included within the controller 104.

The following discussion of the various modules depicted within the controller 104 are meant to be illustrative and not limiting. For example, the various modules described in FIG. 2A are not limited to being executed within the controller 104; one or more modules can be executed outside the controller 104. As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combinations thereof. In other embodiments, a module can include memory that stores instructions executable by a controller to implement a feature of the module. Thus, the controller can be configured with hardware and/or firmware to perform the various functions described herein.

The modules within the controller (e.g., modules 202 and 204) are communicatively coupled to each other by a bus 206. The module 202 interfaces with the host 106 and includes a host interface 208 and a physical layer interface 210 that provides the electrical interface between the host 106 or next level storage controller and the controller 104. The host interface 208 facilitates transfer of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the memory block 110 and includes an error correcting code (ECC) engine 212. In some embodiments, the ECC engine 212 encodes host data received from the host 106 and stores the encoded host data in the memory block 110. When the host data is read out from the memory block 110, the ECC engine 212 decodes the host data and corrects errors detected within the host data. The example module 204 also includes a sequencer 214 and a Redundant Array of Independent Drives (RAID) module 216. In various embodiments, the sequencer 214 generates command sequences, such as program and erase command sequences that are transmitted to the memory block 110. The RAID module 216 generates RAID parity and recovery of failed data. The RAID parity can be used to provide an additional level of integrity protection for data written into the non-volatile memory die 110. In some embodiments, the ECC engine 212 implements the functions of the RAID module 216.

The example module 204 also includes a memory interface 218 that provides the command sequences to the memory block 110 and receives status information from the memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104, additional modules within the controller 104 include a dummy word line (DW) pattern generation module 222, a DW error analysis module 224, and a parameter adjustment module 226. Dummy word lines are placed on non-volatile memory die 110 that are used for the purposes of analyzing and tracking behavior and a quality of a respective non-volatile memory die. In various embodiments, the DW pattern generation module 222 puts a known data pattern into a dummy word line and tracks or periodically check for errors by reading the data back out of the dummy word line and comparing the data to the known data pattern. In accordance with methods described herein, the DW error analysis module 224 and the DW pattern generation module 222 can perform a quality check of a candidate key block or a key block.

In various embodiments, the parameter adjustment module 226 adjusts parameters associated with a particular non-volatile memory die or more specifically a particular memory block. For example—and as discussed further below—the parameter adjustment module 226 can adjust the parameters associated with a particular block including, erase, program, and read parameters. In accordance with methods described herein, the parameters associated with a key block are different from the parameters associated with a normal block. The parameters adjustment module 226 adjusts the parameters associated with a candidate key block as part of converting a normal block to a key block. The parameters associated with the key block are subsequently used to erase, program and read data in the key block.

Additional modules within the example controller 104 include a buffer manager/bus controller 228 that manages, for example, buffers in the RAM 230 and controls the internal bus arbitration of the bus 206 in the controller 104. Additionally, the example controller 104 includes a media management layer 236 that performs wear leveling of the memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 114 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the memory block 110. Accordingly, modules and components within an example controller 104 have been described.

Figure 2B:
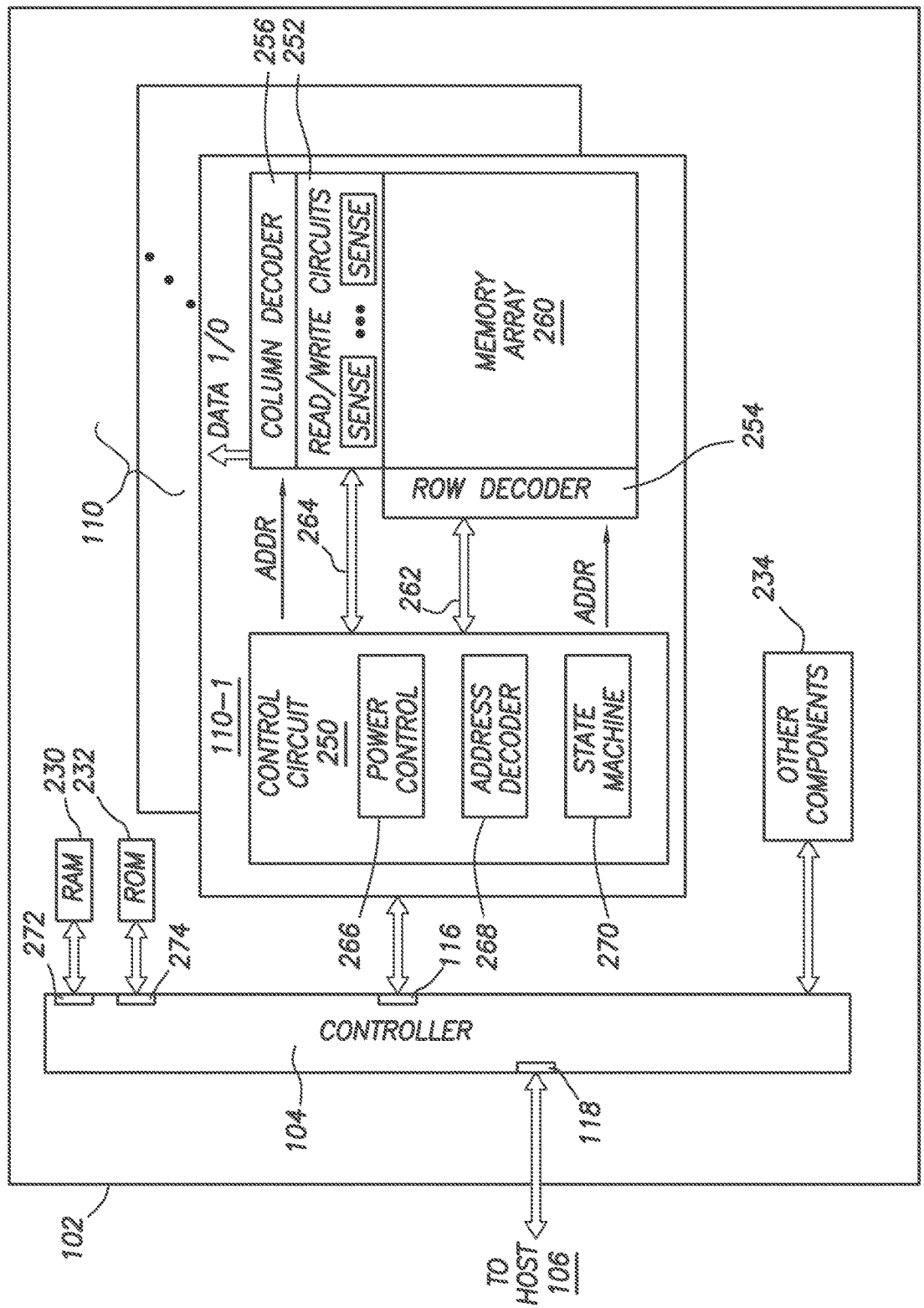
FIG. 2B illustrates a block diagram of example components of a non-volatile memory storage system, in accordance with some embodiments.

FIG. 2B shows in block diagram form, various features of the memory block 110 within the storage system 102. In FIG. 2B, the controller 104 is illustrated as a single block. Additionally, in order to orient the reader, previously described RAM 230, the ROM 232, and the other components 234 are included in FIG. 2B. Although the discussion in FIG. 2B centers on the memory die 110-1, each of the features discussed in relation to the memory die 110-1 equally applies to all the memory die within the memory block 110.

In various embodiments, the example memory die 110-1 includes control circuit 250, read/write circuits 252, a row decoder 254, a column decoder 256, and a memory array 260. The example control circuit 250 includes a power control circuit 266, an address decoder 268, and a state machine 270. In some embodiments, the power control circuit 266, the address decoder 268, and the state machine 270 can be collectively referred to as "managing circuits." The control circuit 250 and its various managing circuits, are communicatively coupled by various interfaces (e.g., interfaces 262 and 264) to the row decoder 254 and the column decoder 256. In various embodiments, the control circuit 250 performs various operations on the memory array 260 that include reading or writing to the memory cells. The read/write circuits 252 read and program pages of memory within the memory die 110-1, in parallel. Additionally, the memory array 260 is accessed by word lines via the row decoder 254 and by bit lines via the column decoder 256.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. For example, the address decoder 268 converts an address provided by the host 106 to an address that is understood and compatible with a format used by the row decoder 254 and the column decoder 256. The state machine 270 provides chip-level control of memory operations.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260 which reduces the densities of access lines and circuitry on each side of the memory array 260.

The discussion now turns to an example method in which the storage system 102 selects a candidate key block, checks a quality of the candidate key block, and alters the candidate key block prior to storing key data in the candidate key block. A memory block set up to store key data—e.g., a key block—is treated differently from a memory block set up to store non-key data—e.g., a normal block storing host data. For purposes of this discussion, a normal block stores normal data that includes host data, or additional content waiting to be stored in a key block, such as system tables and parameters. Additionally, normal data includes ECC parity data. The methods described below additionally include managing the key block by checking the quality of the key block and moving key data out of the key block when the quality of the key block falls below a threshold value. The quality check of the key block can occur on a periodic basis or can be triggered by an event.

Figure 3A:
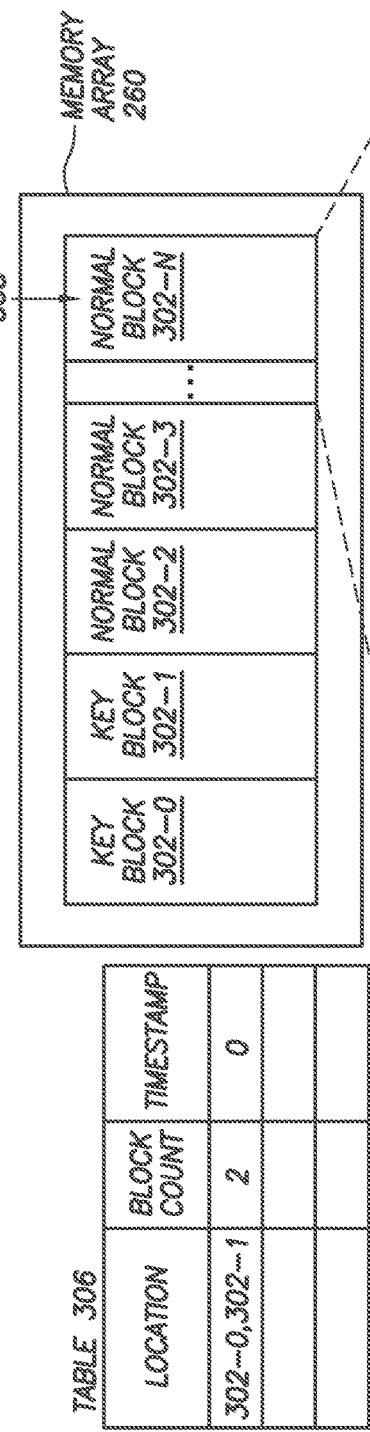
FIG. 3A illustrates a conceptual and method diagram in which a key block is selected and monitored, in accordance with some embodiments.
Figure 3A:
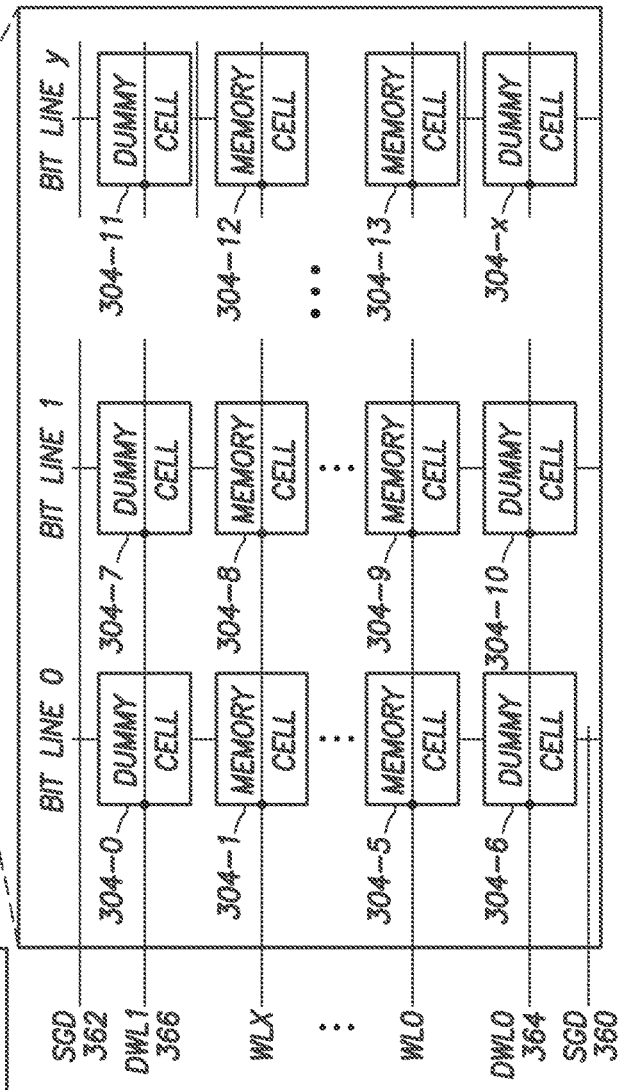

In FIG. 3A, additional details of the example memory array 260 are shown. The example memory array 260 includes several memory blocks 302, where each memory block is defined as a unit of erasure. That is, in flash memory, all memory cells in the memory block 302 are erased together as a block. In one example, the memory array 260 includes 1,024 blocks, however, the memory array 260 can be partitioned into any number of blocks. Additionally, each of the memory blocks 302 can be conceptually divided into a number of pages defined as a unit of programming. In one embodiment, a page of data can be stored in one row of memory cells.

Each of the memory blocks 302 include arrays of memory cells, arranged for example, as a two-dimensional array or memory cells or a three-dimensional array of memory cells. A more detailed view of the example memory block 302-N is shown in block diagram form, as indicated by the dashed lines. Discussions of the example memory block 302-N apply equally to the other memory blocks 302 in the memory array 260.

The example memory block 302-N is configured to operate as a normal block 302-N and includes a two-dimensional array of memory cells 304, arranged in an array of columns (bit lines) and rows (word lines), where the address of a memory cell represents the intersection of a bit line and a word line corresponding to the memory cell. Specifically, each of the columns of memory cells 304 are coupled to a respective bit line, while each of the rows of memory cells 304 are coupled to a respective word line. Additionally, each of the columns of memory cells 304 is coupled to a select gate drain (SGD) and a select gate source (SGS) lines.

The individual memory blocks 302 can be programmed and accessed using different sets of parameters, based on the type of data a respective memory block 302 is configured to store—e.g., non-key data or key data. In the example memory array 260, two memory blocks, key blocks 302-0 and 302-1, are configured to store key data (the memory blocks operate in a "key block mode") and three memory blocks, normal blocks 302-2, 302-3, and 302-N are configured to store non-key data—e.g., host data (the memory block operate in a "normal mode"). The example key blocks 302-0 and 302-1 are programmed and accessed using a first set of parameters, while the example normal blocks 302-2, 302-3, and 302-N are programmed and accessed using one or more sets of parameters, different from the first set of parameters. At any given time, the controller 104 can change the configuration of a memory block to change it from a normal block to a key block and vice versa.

The controller 104 can track which memory block is configured to operate as a key block using the table 306. In one example, the default configuration of the memory blocks in the memory array 260 is to operate as normal blocks. As normal blocks are converted to operate as key blocks and vice versa, the storage system 102 tracks the memory blocks that have been configured to operate as a key block using table 306. The table 306 is stored in various locations throughout the storage system 102 based on a state of the storage system 102. For example, when the storage system 102 is off or between power cycles, the table 306 is stored in the memory array 260, and more specifically in a key block storing boot data. When the storage system 102 is on or during an operation of the storage system 102, the table 306 can be moved into the RAM 230 of the storage system 102, or into a memory of the host 106.

The example in FIG. 3A illustrates a method in which a controller 104 converts a normal block to a key block, monitors the key block, and subsequently moves key data from the key block to a different key block. In Step 1, the controller 104 selects a candidate key block 308 (e.g., operating as normal block 302-N at the time of selection) and checks a quality of the candidate key block 308. Various events can cause the controller 104 to convert a normal block to a key block. For example, the controller 104 can select a candidate key block when an amount of key data stored in the memory array 260 increases and additional key blocks are needed to store the key data. Additionally, the controller 104 can select a candidate key block, when key data is moved from a former key block.

A variety of methods can be used to check the quality of the candidate key block 308. For example, the controller 104 checks a quality of the candidate key block 308 by checking the non-data word lines of the candidate key block 308, such as the SGS line 360, the SGD line 362, or a dummy word line (DWL). For example, the controller 104 can perform a threshold voltage (Vt) scan of DWL0 364 or DWL1 366. During the Vt scan, the controller 104 can shift a read level and check the number of bits that are not in an expected range. If the number of bits that are not in an expected range are above a threshold value, the quality of the candidate key block 308 is poor.

In some embodiments, an output of the Vt scan includes a resultant threshold voltage distribution of the dummy cells. The resultant threshold voltage distribution is compared to an expected threshold voltage distribution to determine how closely the two distributions match to determine a quality of the candidate key block 308. If the difference between the resultant threshold voltage distribution and the expected threshold voltage distribution is greater than a threshold value, the quality of the candidate key block 308 is poor. In additional embodiments, the DW pattern generation module 222 (FIG. 2A) puts in a known data pattern into a dummy word line—e.g., DWL0 or DWL 1 and checks for errors by reading the data pattern back out and comparing the data to the known data pattern. If the difference between the data pattern read back out and the known data pattern is greater than a threshold value, the quality of the candidate key block 308 is poor.

In situations where the quality of the candidate key block 308 is assessed as poor, the controller 104 flags the candidate key block 308 as faulty and the candidate key block 308 is not converted to a key block (e.g., the candidate key block 308 remains a normal block 302-N). For purposes of the example in FIG. 3A, the quality of the candidate key block 308 is assessed as good.

Figure 3B:
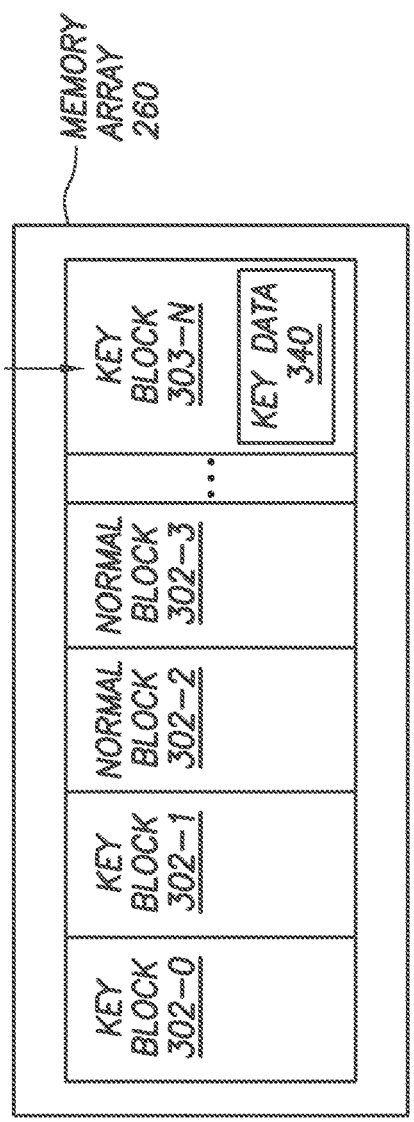
FIG. 3B illustrates a conceptual and method diagram in which a key block is selected and monitored, in accordance with some embodiments.

In FIG. 3B, the memory block 302-N operating as a normal block is converted to operate as the key block 303-N. Specifically, in Step 2, the controller 104 alters operating parameters of the candidate key block and registers the candidate key block as a key block. The operating parameters include an erase parameter, a program parameter, and a read parameter. In some examples, the parameter adjustment module 226 (FIG. 2A) adjusts the operating parameters associated with the candidate key block 308, such that a read margin of the key block is increased.

Figure 3C:
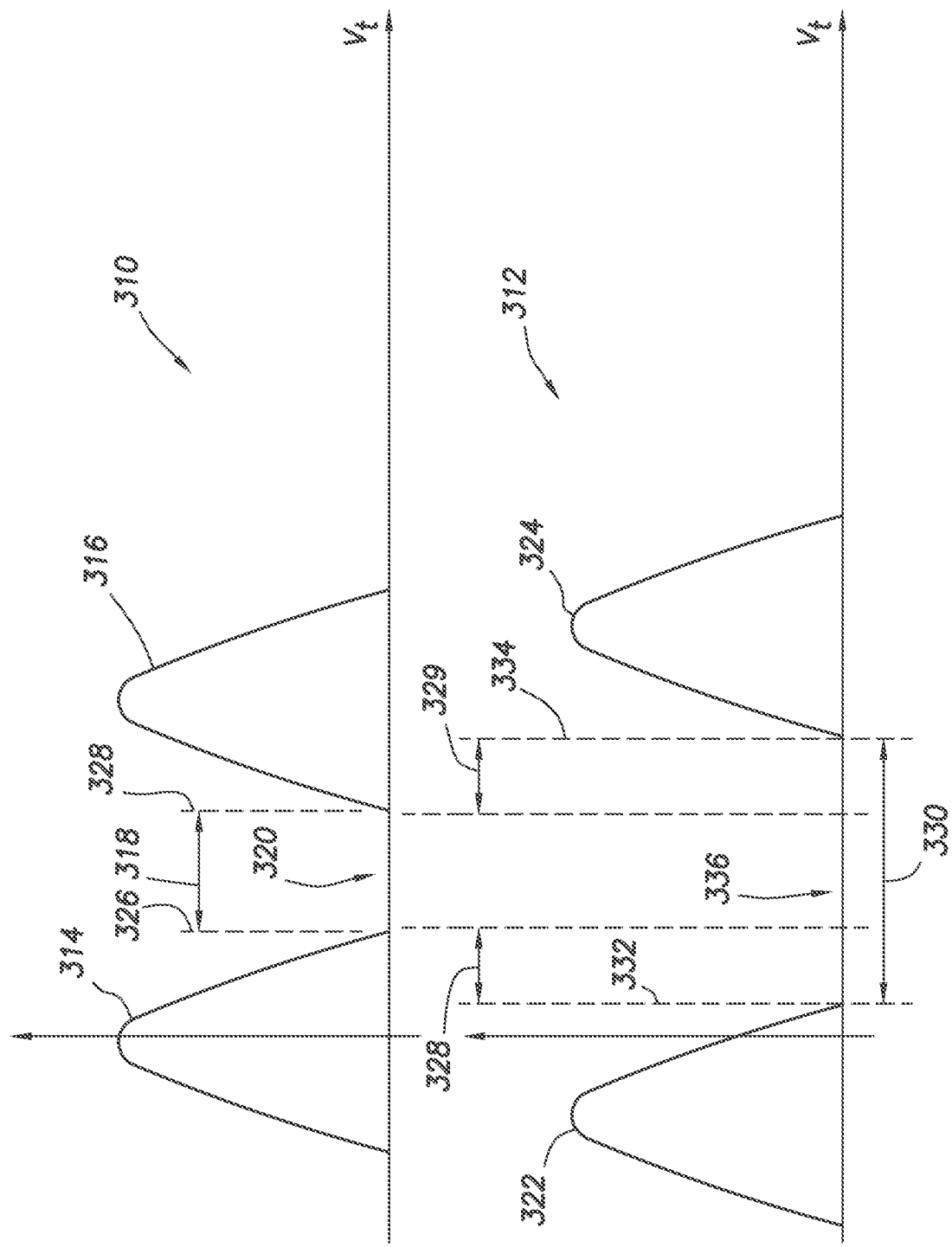
FIG. 3C illustrates distribution plots, in accordance with some embodiments.

The distribution plots 310 and 312, in FIG. 3C, illustrate how the read margin of the candidate key block 308 is increased. In particular, the distribution plots 310 and 312 illustrate the voltage threshold (Vt) distribution of erased and programmed memory cells in a normal block and a key block, respectively. For purposes of this example, a normal block is associated with a first set of operating parameters including: a first erase parameter, a first program parameter, and a first read parameter. Additionally, a key block is associated with a second set of operating parameters including: second erase parameter, a second program parameter, and a second read parameter.

The distribution plot 310 illustrates the voltage threshold (Vt) distribution curves 314 and 316 of a memory block operating as a normal block. The distribution curve 314 represents the Vt distribution of memory blocks that were erased using the first erase parameter and the distribution curve 316 represents the Vt distribution of memory blocks programmed with the first program parameter. A erase verify level 326 is defined at the right-most portion of the distribution curve 314, while a program verify level 328 is defined at the left most portion of the distribution curve 316. A resultant read margin 318 is defined between the erase verify level 326 and the program verify level 328, and read level 320 is defined within the read margin 318.

In contrast, the distribution plot 312 illustrates the Vt distribution curves 322 and 324 of a memory block operating as a key block. The distribution curve 322 represents the Vt distribution of memory blocks that were erased using the second erase parameter and the distribution curve 324 represents the Vt distribution of memory blocks programmed with the second program parameter. A erase verify level 332 is defined at the right-most portion of the distribution curve 322, while a program verify level 334 is defined at the left most portion of the distribution curve 324. A resultant read margin 330 is defined between the erase verify level 332 and the program verify level 334, and a read level 336 is defined within the read margin 330.

As can be seen by a comparison between the two distribution plots 310 and 312, and their respective erase and program verify levels, the erase verify level 332 (associated with erased key blocks) is shifted to the left of the erase verify level 326 (associated with erased normal blocks) by an amount 328. Similarly, the program verify level 334 (associated with programmed key blocks) is shifted to the right of the program verify level 328 (associated with programmed normal blocks) by an amount 329. The shift between the distribution curves results in the read margin 330 (between erased and programmed key blocks) that is greater than the read margin 318 (between erased and programmed normal blocks).

Thus, with regards to key blocks, the second erase parameter implements an erase operation that uses a deeper erase condition than the first erase parameter used for a normal block. Similarly, the second set of operating parameters implements a slower and stronger programming condition, than the first program parameter used for a normal block. The deeper erase condition and stronger program condition are one example of how the key block is treated differently to reduce a chance of data corruption in the key block.

In addition to the second erase and program parameters, a key block is configured to be read using a second read parameter. A second read parameter can be set to comply with second erase and program parameters. In some embodiments, the second read parameter is conditioned such that the controller 104 employs a slower sensing time in order to mitigate a word line and bit line bit voltage irregularity.

The second set of parameters, including the slower and stronger programming condition, the deeper erase condition, and the slower sensing time during a read, cause the performance of the key block 308 to become slightly slower than the performance of a normal block. By altering the operating parameters of the key block 308, the performance is slightly slower with the tradeoff of increased reliability.

Returning back to Step 2, in FIG. 3B, the controller 104 associates the second set of parameters with the candidate key block 308 and registers the candidate key block 308 as the key block 303-N. In accordance with various embodiments, the controller 104 updates the table 306 with an entry 338 that reflects all the key blocks configured within the memory array 260 at a particular time. The entry includes values such as a location of each of the key blocks, a count of the total number of key blocks, and a timestamp. In some embodiments, after registering the candidate key block— e.g., by updating the table 306, the controller 104 erases prior data in the key block 303-N using the second erase parameter, and subsequently stores key data 340 using the second program parameter. The prior data can include data stored in the memory block when operating as the normal block 302-N (e.g., host data).

In FIG. 3D, after the key block 303-N is configured and registered, the key block 303-N fails a check, and the key block 303-N is converted back to operating as a normal block, and the table 306 is updated with entry 380. In particular, in Step 3, the controller 104 continues to monitor the key block 303-N throughout the lifetime of the key block and checks for indications of data degradation of the key data 340. The controller 104 keeps a respective key data in a given key block, however, if at any point, the given key block fails a check, the respective key data is moved to a different key block. For the purposes of this example, in Step 3, the key block 303-N fails a check, and the controller 104 moves the key data 340 out of the key block 303-N.

Monitoring the key block 303-N takes many forms. The monitoring can occur on a periodic basis, as well as be triggered by an event. The events that trigger a check of the key block 303-N can be historically tied to data degradation (e.g., triggering a read error handing operation, an excessive number of reads). Examples of some events include a program erase (PE) cycle, a number of reads of the key block meeting a threshold value, an occurrence of a read error handling operation when reading the key data, an occurrence of a high bit error rate when reading the key data, and a temperature change in the storage system 102. An example of monitoring on a periodic basis includes performing a quality check on the key block at specific time intervals (e.g., every 24 hours).

The discussion turns to additional details of events that can trigger a check of the key block 303-N. In some embodiments, each time a key block undergoes a program erase (PE) cycle, the controller 104 assesses a quality of the key block. The various methods used to assess the quality of the key block are similar to those described above with regards to assessing the quality of the candidate key block 308. For example, the quality of the key block 303-N is checked by performing a Vt scan of the non-data word lines of the key block 303-N. In circumstances where a key block fails a quality check during a PE cycle, the key data is moved out of the key block to a different key block, and the key block is flagged as faulty. Subsequently the key block is converted to a normal block.

In another example, the controller 104 tracks the number of times the key block 303-N has been read using a counter. Once the counter meets a threshold value, the controller 104 moves the key data 340 to a different key block. In other embodiments, upon the counter meeting the threshold value, the controller 104 checks the quality of the key block 303-N, and then makes a determination as to whether to move the key data to a different key block.

In some embodiments, the periodic check is condition based. That is, monitoring on a period basis commences once a condition is met. One condition includes a temperature difference greater than a threshold amount, such as 40 degrees Celsius, experienced by the storage system 102 in a given 24 hour period. In this example, once the storage system 102 experiences this condition (e.g., a temperature change greater than 40 degrees Celsius within a 24 hour period), the controller 104 monitors the key blocks on a periodic basis. The controller 104 continues to monitor the key blocks, until the condition is no longer met—e.g., within a subsequent 24 hour period, the temperature change of the storage system 102 was less than 40 degrees Celsius. In another example, a condition includes a threshold temperature value of the storage system 102, instead of a temperature difference. That is, if the temperature of the storage system 102 exceeds the threshold temperature value, the controller 104 begins monitoring the key blocks on a periodic basis.

For the purposes of the example in FIG. 3D, the storage system 102 encounters a large temperature swing, greater than 40 degrees Celsius occurring within a 24 hour period. In some embodiments, the controller 104 receives a temperature reading of the storage system 102 on a periodic basis, such as every one second. Upon determining a temperature difference greater than 40 degrees Celsius has occurred, the controller 104 commences a periodic check of the key blocks, including key block 303-N. As part of the check, the controller 104 conducts a more intense or higher priority read scrub on the key blocks than a read scrub that is applied to a normal block.

In various embodiments, a more intense or higher priority read scrub procedure includes the steps of reading the key data as first key data, correcting detected errors in the first data to create corrected key data and writing the corrected key data to the same location. As part of the read process, the controller 104 decodes the key data and corrects the key data. As part of writing process, the controller 104 can re-scramble the corrected key data prior to writing the corrected key data in the key block 303-N.

During the more intense or higher priority read scrub, if the controller 104 encounter a read error, the key data 340 is moved to a different block. The key data 340 is moved even if the key data is recovered through a read error handling procedure. Furthermore, if during the more intense or higher priority read scrub a high bit error rate is detected in the first key data (e.g., bit error rate higher than a threshold amount), the key data is moved as well, even if the key data is recovered through a read error handling procedure.

In the example provided in FIG. 3D, the controller 104 performs a more intense or higher priority read scrub on the key block 303-N and encounters a read error. Accordingly, the controller 104 undergoes the process of moving the key data 340. In the example provided, an additional key block is selected (formerly normal block 302-3 in FIG. 3B), and goes through the methods described in FIGS. 3A and 3B to convert the normal block 302-3 to the key block 304-M. Subsequently, the controller 104 moves the key data 340 from the key block 303-N to the key block 303-M.

Next the controller 104 performs a check on the quality of the key block 303-N by checking the non-data word lines, similar to the methods described in FIG. 3A. In this example, the controller 104 determines the quality of the key block 303-N is poor and thus marks the key block 303-N as faulty. The controller 104 converts the key block 303-N to a normal block 302-M by associating the first set of operating parameters to the memory block. In some embodiments, the controller 104 tracks the normal block 302-M (e.g., by using the flag) as a block that should not be selected as a candidate key block in the future.

Accordingly, FIGS. 3A-3D describe methods directed to checking a quality of a candidate key block, preparing the candidate key block to operate as a key block, and subsequently monitoring the key block throughout a lifetime of the key block. Monitoring the key block includes periodically checking the key block with a more intensive read scrub and moving key data out of the key block when a read error is encountered. Additionally, key data is moved out if a quality of the key block becomes poor. The methods applied to the key block differ from a treatment of a normal block.

The disparate treatment of the memory blocks by the storage system 102 is implemented in an effort to provide a more secure and robust storage solution for key data that is pertinent to the boot up of the storage system. The key data includes data specific to the operation and configuration of the storage system 102. A result of applying the method described herein, to configure the key blocks, is slower, erase, program, and read cycles. Additionally, the operation of the key blocks in a manner described herein is more resource intensive. Thus, the methods to securely store key data in a robust manner are not applied to all the blocks—e.g., normal blocks—in the memory array, as that would result in a slower storage system 102 that requires more power.

Figure 4:
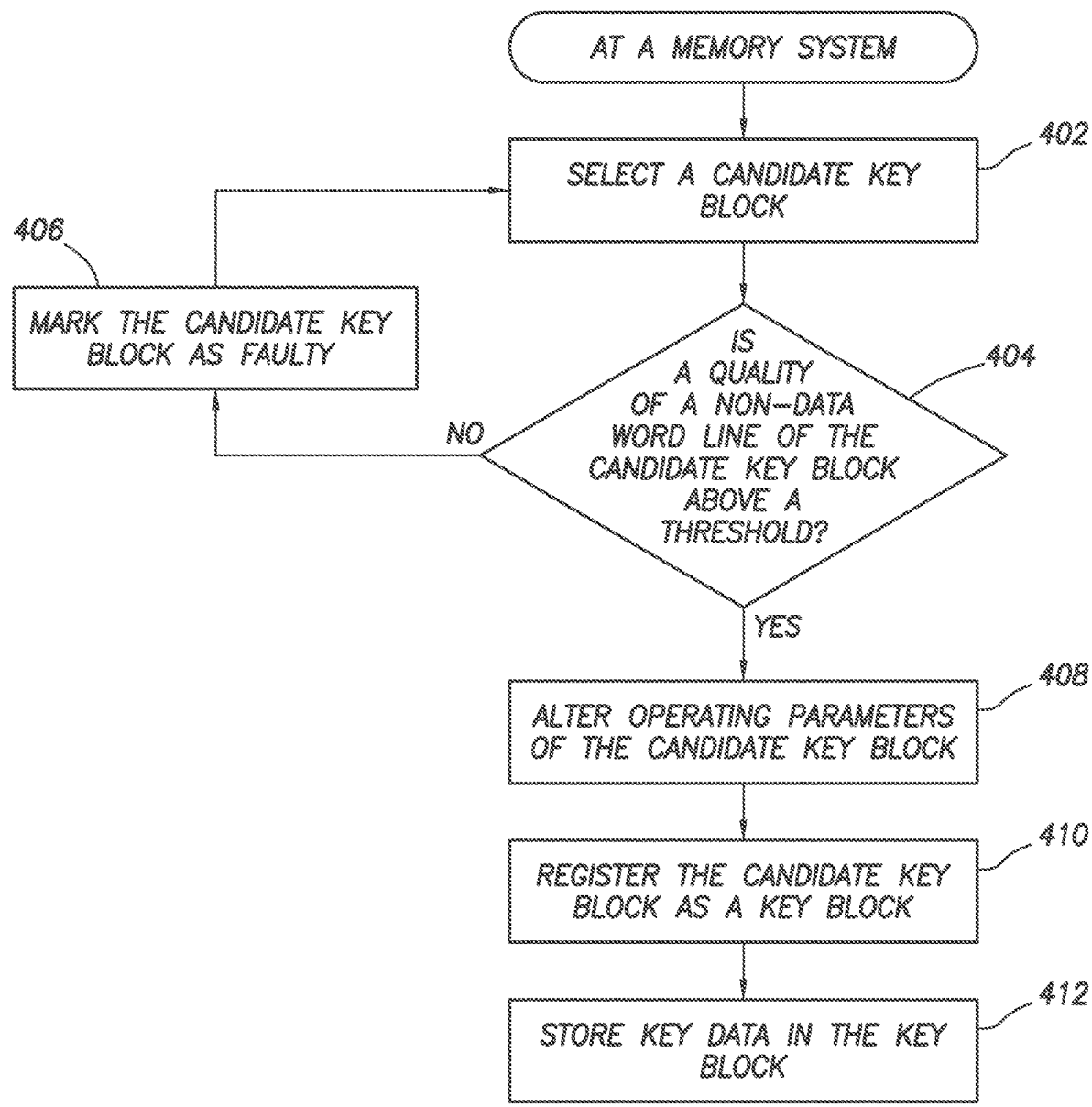
FIG. 4 illustrates a method diagram, in accordance with some embodiments.

FIG. 4 shows a method in accordance with at least some embodiments. In particular, the method is performed at a memory system (e.g., the storage system 102) and includes selecting a candidate key block (block 402). Next the memory system determines if a quality of the non-data word line of the candidate key block is above a threshold (decision block 404). If the quality if at or below the threshold, then the memory system marks the candidate key block as faulty (block 406). In some embodiments, the memory system tracks the memory block marked as faulty and does not select those as candidate key blocks at a future time.

If the quality if the candidate key block is above the threshold, the memory system alters the operating parameters of the candidate key block (block 408) and registers the candidate key block as a key block (block 410). In various embodiments, the memory system updates a table that tracks a location of all the key blocks in the memory array, as well as a count of the total number of key blocks in the memory array. The memory system stores key data in the key block (block 412) using the second set of operating parameters. The second set of operating parameters implements a deeper erase condition and a stronger programming condition. Thereafter, the memory system can continue monitoring the key block (starting at block 500, in FIG. 5)

Figure 5:
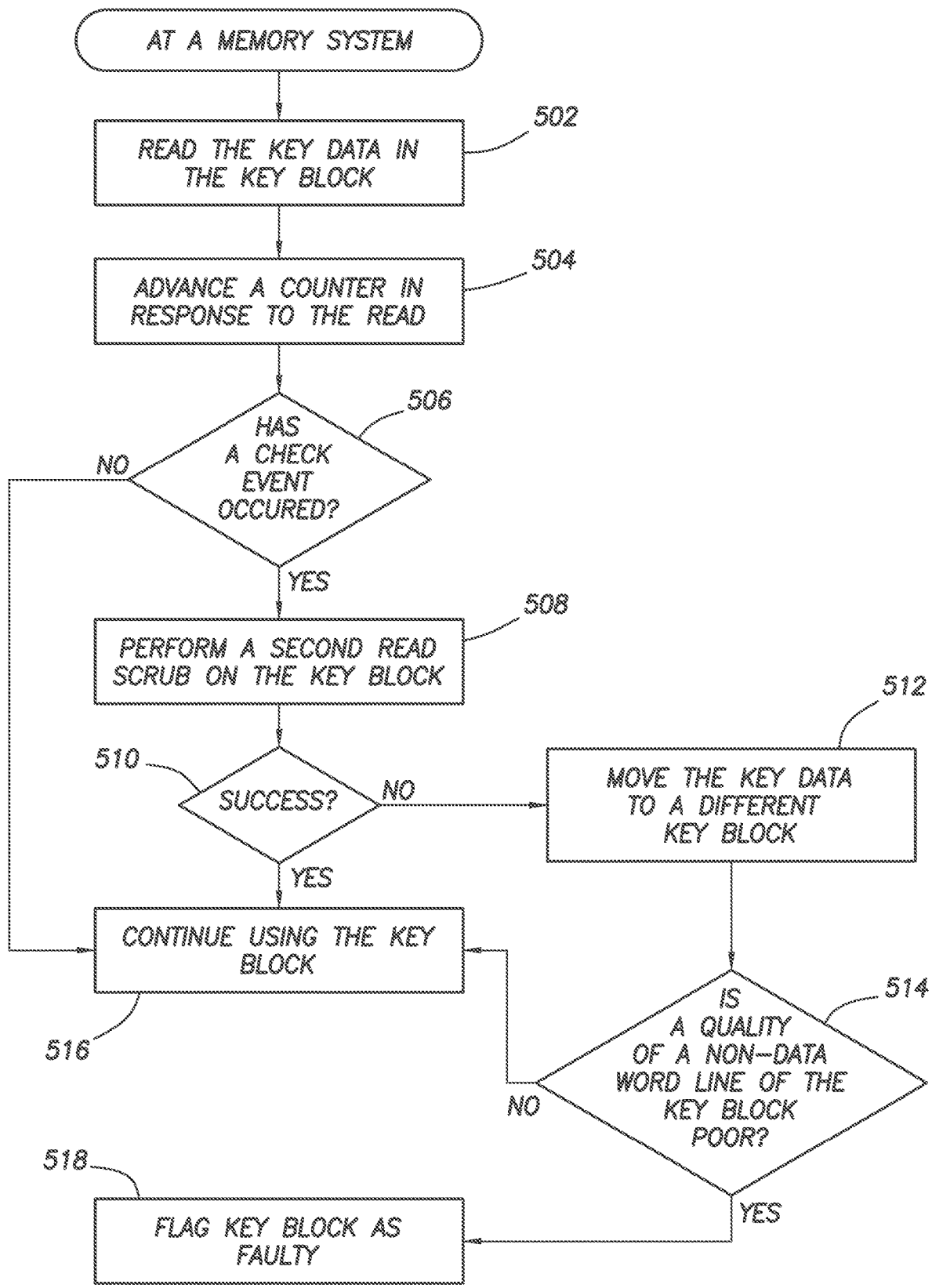
FIG. 5 illustrates a method diagram, in accordance with some embodiments.

FIG. 5 shows a method in accordance with at least some embodiments. In particular, the method is performed at a memory system (e.g., the storage system 102) and includes reading the key data in the key block (block 502) and advancing a counter in response to the read (block 504). For the purposes of this disclosure, the term "advance" as pertaining to a counter includes both incrementing and decrementing the counter. Additionally, the counter can be set to any initial value, including for example, zero, a negative number or a positive number.

Next the memory system determines whether a check event has occurred (decision block 506). Some check events include a number of reads meeting or surpassing a threshold value. Other check events include a change in temperature of the memory system above a threshold value. If a check event has not occurred, the memory system continues to use the key block (block 516). If a check event occurs—e.g., a temperature difference greater than 40 degrees Celsius has occurred within a 24 hour period—the memory system performs a secondary read scrub on the key block (block 508). The secondary read scrub is a more intense or higher priority read scrub on the key blocks than a read scrub that is applied to a normal block.

At decision block 510, the memory system determines whether issues were encountered during the secondary read scrub. If issues were not encountered during the secondary read scrub, the memory system continues using the key block (block 516). In contrast, if issues are encountered during the secondary read scrub, for example, if during the secondary read scrub, the memory system detects a high bit error rate in the key data or a read error, the memory system moves the key data to a different key block (block 512). The memory system moves the key data even if the key data is recoverable. After moving the key data to a different key block, the memory system checks a quality of the key block (decision block 514). The memory system check the quality of the key block by checking a non-data wordline of the key block. If the quality of the key block is good, the memory system continues to use the key block (block 516). However, if the quality of the key block is poor, the memory system flags the key block as faulty (block 518). In some embodiments, the memory system converts the key block to a normal block after marking the key block as faulty.

The above discussion is meant to be illustrative of the principles and various embodiments of the present invention. Numerous variations and modifications will become apparent to those skilled in the art once the above disclosure is fully appreciated. For example, although a controller 104 has been described as performing the methods described above, any processor executing software within a host system can perform the methods described above without departing from the scope of this disclosure. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A method for preparing a key block in a memory system, comprising:
    selecting a candidate key block of memory;
    checking a quality of the candidate key block using a non-data word line of the candidate key block;
    altering operating parameters of the candidate key block;
    registering the candidate key block as the key block;
    receiving a value indicative of temperature of the memory system;
    determining the value indicative of temperature is above a temperature threshold amount;
    in response to determining the value indicative of temperature is above the temperature threshold amount, performing a read scrub operation on the key block to retrieve key data in the key block as second key data,
    determining a bit error rate of the second key data is above a bit error rate threshold amount; and
    in response to determining the bit error rate of the second key data is above the bit error rate threshold amount, moving the second key data to a second key block.

2. The method of claim 1, wherein altering the operating parameters further comprises replacing a first set of parameters associated with the candidate key block with a second set of parameters, wherein:
    the first set of parameters includes a first erase parameter, a first program parameter, and a first read parameter, wherein the first set of parameters is used to access a memory block that is a normal block, and
    the second set of parameters includes a second erase parameter, a second program parameter, and a second read parameter, wherein the key block is accessed using the second set of parameters, and the second set of parameters is different from the first set of parameters.

3. The method of claim 2, further comprising:
    erasing a first data in the key block using the second erase parameter; and
    programming the key data in the key block using the second program parameter, wherein the second erase and program parameters create a read margin of the key block that is greater than a read margin created by the first erase and program parameters.

4. The method of claim 1, wherein checking the quality of the candidate key block further comprises:
    performing a voltage threshold scan, with an adjusted read level, to generate test data from the non-data word line of the candidate key block;
    comparing the test data to an expected value; and
    determining the quality of the candidate key block based on the comparing.

5. The method of claim 1, further comprising:
    selecting a second candidate key block of memory;
    checking a quality of the second candidate key block using a non-data word line of the second candidate key block;
    determining the quality of the second candidate key block is poor; and
    flagging the second candidate key block as faulty.

6. The method of claim 3, further comprising:
    in response to determining the value indicative of temperature is above the temperature threshold amount, performing a read error handling operation to recover a portion of the key data as recovered data; and
    moving the recovered data to the second key block.

7. The method of claim 3, further comprising:
    checking, at a predetermined time interval, a quality of the key block; and
    in response to determining the quality of the key block is poor, moving the key data to the second key block.

8. The method of claim 3, further comprising:
    determining a number of reads of the key block is greater than a read threshold amount; and
    moving the key data to the second key block.

9. A memory controller, comprising:
    a first port configured to couple to a memory array;
    the memory controller configured to:
        select a candidate key block in the memory array, the memory array including a second memory block operating in a normal mode;
        check a quality of the candidate key block using a non-data wordline of the candidate key block;
        associate a first set of parameters with the candidate key block, the first set of parameters including a first erase parameter, a first program parameter and a first read parameter;
        register the candidate key block as a key block,
        receive a value indicative of temperature of the memory array;
        determine the value indicative of temperature is above a temperature threshold amount;
        in response to determining the value indicative of temperature is above the temperature threshold amount, performing a read scrub operation on the key block to retrieve key data in the key block as second key data,
        determine a bit error rate of the second key data is above a bit error rate threshold amount; and in response to determining the bit error rate of the second key data is above the bit error rate threshold amount, moving the second key data to a second key block.

10. The memory controller of claim 9, wherein when the memory controller associates the first set of parameters, the memory controller is further configured to:
   adjust the first erase parameter from a second erase parameter; and
   adjust the first program parameter from a second program parameter, wherein:
      the second memory block operating in a normal mode is programmed using the second erase and program parameters, and
      a read margin of the candidate key block is greater than a read margin of the second memory block operating in the normal mode.

11. The memory controller of claim 9, wherein the memory controller is further configured to program data in the key block using the first set of parameters, and wherein the first set of parameters is different from a second set of parameters used to access the second memory block operating in the normal mode.

12. The memory controller of claim 9, wherein the memory controller is further configured to:
   select the second memory block as a second candidate key block;
   check a quality of the second candidate key block using a non-data word line of the second candidate key block; and
   in response to determining the quality of the second candidate key block is poor, flag the second candidate key block as faulty.

13. A non-volatile storage system, configured to monitor a key block, comprising:
   a memory array storing a first data in a first block of memory in the memory array, wherein the first block is accessed using a first set of parameters and the first block is a key block; and
   a controller coupled to the memory array, wherein the controller is configured to:
      determine a check event has occurred associated with the key block, wherein the check event comprises a temperature of the storage system rising above a temperature threshold amount;
      in response to determining the check event has occurred, perform a read scrub on the key block to retrieve the first data as second data;
      determine a bit error rate of the second data is above a bit error rate threshold amount; and
      in response to determining the bit error rate of the second data is above the bit error rate threshold amount, move the second data to a second key block in the memory array.

14. The non-volatile storage system of claim 13, wherein the check event further comprises the temperature of the storage system rising above the temperature threshold amount within a time interval.

15. The non-volatile storage system of claim 13, wherein when the controller performs the read scrub, the controller is further configured to:
   perform a read error handling operation to recover a portion of the first data as recovered data; and
   move, in response to performing the read error handling operation, the recovered data to the second key block.

16. The non-volatile storage system of claim 13, wherein the controller is further configured to:
   determine a number of reads of the second key block is greater than a read threshold amount; and
   move the second data of the second key block to a different key block.

17. The non-volatile storage system of claim 13, wherein the controller is further configured to:
   check a quality of the key block; and
   in response to determining the quality of the key block is poor, convert the key block to a normal block.

18. The non-volatile storage system of claim 13, wherein the controller is further configured to:
   monitor a number of reads of the second key block;
   in response to a second check event occurring, perform an additional secondary read scrub on the second key block;
   in response to a read error occurring during the additional secondary read scrub, move a data in the second key block to a different key block;
   in response to determining a quality of a non-data word line of the second key block is poor, flag the second key block as faulty; and
   convert the second key block to a normal block.

* * * * *